US010703924B2

(12) United States Patent
Walker et al.

(10) Patent No.: US 10,703,924 B2
(45) Date of Patent: Jul. 7, 2020

(54) CONDUCTIVE INK FOR A ROLLERBALL PEN AND CONDUCTIVE TRACE FORMED ON A SUBSTRATE (71) Applicant: ELECTRONINKS WRITEABLES, INC., Austin, TX (US)

(72) Inventors: Steven Brett Walker, Austin, TX (US); Analisa Russo, Cambridge, MA (US)

(73) Assignee: ELECTRONINKS WRITEABLES, INC., Austin, TX (US)

( * ) Notice: Subject to any disclaimer, the term of this patent is extended or adjusted under 35 U.S.C. 154(b) by 542 days.

(21) Appl. No.: 15/314,498

(22) PCT Filed: May 21, 2015

(86) PCT No.: PCT/US2015/031898
§ 371 (c)(1),
(2) Date: Nov. 28, 2016

(87) PCT Pub. No.: WO2015/183679
PCT Pub. Date: Dec. 3, 2015

(65) Prior Publication Data
US 2017/0107390 A1 Apr. 20, 2017

Related U.S. Application Data (60) Provisional application No. 62/005,305, filed on May 30, 2014.

(51) Int. Cl.
*C09D 11/52* (2014.01)
*C09D 11/18* (2006.01)
(Continued)

(52) U.S. Cl.
CPC .............. *C09D 11/52* (2013.01); *C09D 11/18* (2013.01); *H05K 1/0274* (2013.01); *H05K 1/097* (2013.01);
(Continued)

(58) Field of Classification Search
None
See application file for complete search history.

(56) References Cited

U.S. PATENT DOCUMENTS 4,827,083 A * 5/1989 Inasaka .................. H05K 1/092
174/264
6,697,694 B2 2/2004 Mogensen
(Continued)

FOREIGN PATENT DOCUMENTS

EP 1583107 A1 * 10/2005
EP 1586604 A1 * 10/2005
(Continued)

OTHER PUBLICATIONS

English translation of JP 2012/151276, Aug. 2012; 24 pages.*
(Continued)

*Primary Examiner* — Helene Klemanski
(74) *Attorney, Agent, or Firm* — VLP Law Group LLP; David A. Roise (57) ABSTRACT

A conductive ink for a rollerball pen comprises an aqueous solvent and conductive particles comprising one or more metals dispersed therein at a concentration of at least about 30 wt. %. The conductive particles include conductive flakes and conductive nanoparticles. A dispersant coats the conductive particles at a loading level of at least about 0.1 mg/m2 to about 0.8 mg/m2. A conductive trace deposited on a substrate from a rollerball pen comprises a percolative network of conductive particles comprising one or more metals. The conductive particles include conductive flakes and conductive nanoparticles. The conductive trace has a conductivity of at least about 1% of a bulk metal conductivity and a reflectance of greater than 40%.

18 Claims, 4 Drawing Sheets (51) Int. Cl.
  *H05K 1/09* (2006.01)
  *H01B 1/22* (2006.01)
  *H05K 1/02* (2006.01)

(52) U.S. Cl.
  CPC ............ *H05K 2201/0245* (2013.01); *H05K 2201/0257* (2013.01)

(56) References Cited

U.S. PATENT DOCUMENTS

| | | | |
|---|---|---|---|
| 7,608,204 B2 | 10/2009 | Kim | |
| 7,922,939 B2 | 4/2011 | Lewis | |
| 7,981,327 B2* | 7/2011 | Sakaguchi | C09D 11/52 252/518.1 |
| 8,236,598 B2 | 8/2012 | Khadilkar et al. | |
| 8,294,040 B2 | 10/2012 | Shimizu | |
| 8,558,117 B2 | 10/2013 | Hanson | |
| 8,828,276 B2* | 9/2014 | Hotta | C09D 11/52 252/502 |
| 9,732,236 B2* | 8/2017 | Kaneda | C09D 11/52 |
| 2001/0028953 A1* | 10/2001 | Bluem | C09J 4/00 428/355 AC |
| 2004/0144958 A1* | 7/2004 | Conaghan | C09D 11/52 252/500 |
| 2005/0204956 A1* | 9/2005 | Berkei | C09D 11/18 106/31.64 |
| 2006/0073667 A1* | 4/2006 | Li | H01B 1/22 438/311 |
| 2006/0163744 A1* | 7/2006 | Vanheusden | C09D 11/52 257/773 |
| 2007/0144305 A1* | 6/2007 | Jablonski | B22F 1/0022 75/252 |
| 2008/0169122 A1* | 7/2008 | Shiraishi | C09D 11/52 174/257 |
| 2008/0277630 A1* | 11/2008 | Kiyoshima | C09D 11/037 252/514 |
| 2009/0127518 A1* | 5/2009 | Nagano | H01B 1/22 252/514 |
| 2009/0314529 A1* | 12/2009 | Petersen | C09D 11/30 174/257 |
| 2010/0009153 A1* | 1/2010 | Yang | C09D 11/52 428/220 |
| 2012/0119153 A1* | 5/2012 | Choi | H01B 1/22 252/500 |
| 2012/0279766 A1* | 11/2012 | Wu | C09D 11/52 174/257 |
| 2013/0142963 A1 | 6/2013 | Kirk et al. | |
| 2013/0302603 A1* | 11/2013 | Konno | H01B 1/22 428/354 |
| 2013/0337240 A1* | 12/2013 | Kim | C09D 11/52 428/208 |
| 2014/0332734 A1* | 11/2014 | Uchida | H01B 1/22 252/514 |
| 2015/0217411 A1* | 8/2015 | Ishikawa | H01B 1/22 257/772 |
| 2015/0252224 A1* | 9/2015 | Iseda | C08K 3/08 428/323 |
| 2016/0198576 A1* | 7/2016 | Lewis | H05K 1/0284 361/761 |
| 2016/0251531 A1* | 9/2016 | Uchida | C09D 11/52 427/58 |
| 2016/0312043 A1* | 10/2016 | Kaneda | C09D 11/52 |
| 2017/0190930 A1* | 7/2017 | Lee | H01B 1/22 |

FOREIGN PATENT DOCUMENTS

| | | | |
|---|---|---|---|
| EP | 1860163 A1 | | 11/2007 |
| EP | 2902449 A1 | | 8/2015 |
| JP | 2001294795 A | | 10/2001 |
| JP | 2007/066824 | * | 3/2007 |
| JP | 2007066824 A | | 3/2007 |
| JP | 2008300046 A | | 12/2008 |
| JP | 2009521598 A | | 6/2009 |
| JP | 2010269516 A | | 12/2010 |
| JP | 2011526054 A | | 9/2011 |
| JP | 2012/151276 | * | 8/2012 |
| JP | 2012151276 A | | 8/2012 |
| JP | 2014080559 A | | 5/2014 |
| WO | 2006095611 A1 | | 9/2006 |
| WO | 2009152388 A1 | | 12/2009 |
| WO | 2013077447 A1 | | 5/2013 |
| WO | WO 2013/077447 A1 | * | 5/2013 |
| WO | 2015087989 A1 | | 6/2015 |
| WO | WO 2015/087989 A1 | * | 6/2015 |

OTHER PUBLICATIONS

English translation of JP 2007/066824, Mar. 2007; 20 pages.*
PCT/US15/031898, International Preliminary Report on Patentability dated Jul. 31, 2015.
PCT/US15/031898, International Search Report dated Jul. 31, 2015.
PCT/US15/031898, Written Opinion of the ISA dated Jul. 31, 2015.
Russo et al. (2011) Adv. Mater. 23 3426-3430.

* cited by examiner

CONDUCTIVE INK FOR A ROLLERBALL PEN AND CONDUCTIVE TRACE FORMED ON A SUBSTRATE

RELATED APPLICATION

The present patent document is a U.S. national stage entry based on International Application No. PCT/US2015/031898 filed May 21, 2015, which in turn claims the benefit of priority under 35 U.S.C. § 1 19(e) to U.S. Provisional Patent Application Ser. No. 62/005,305, filed on May 30, 2014, each of which is hereby incorporated by reference in its entirety.

TECHNICAL FIELD

The present disclosure is related generally to ink formulations more particularly to a conductive ink that may be written onto paper and other substrates to form conductive traces.

BACKGROUND

Printed electronics constitute an emerging class of materials with potential application in photovoltaics, transistors, displays, batteries, antennas, and sensors. Recent attention has focused on paper substrates as a low-cost, enabling platform for flexible, lightweight, and disposable devices. Such devices require conductive electrodes, which, to date, have been deposited by sputter coating, inkjet printing, and airbrush spraying. However, these deposition methods may be costly or may employ dilute inks that readily permeate the paper substrate.

Paper substrates offer many advantages for printed electronic devices. Not only is paper widely available and inexpensive, it is lightweight, biodegradable, and can be rolled or folded into three-dimensional (3D) configurations. Functional electronic components, including thermochromic displays, disposable radio frequency identification (RFID) tags, and cellulose-based batteries have recently been produced on paper substrates. The wide variety of available paper textures, compositions, and coatings can be exploited to enable specific device architectures. Facile routes to creating devices "on-the-fly" under ambient conditions could make it possible to fully exploit the potential of paper-based printed electronics.

BRIEF SUMMARY

A conductive ink for a rollerball pen comprises an aqueous solvent and conductive particles comprising one or more metals dispersed therein at a concentration of at least about 30 wt. %. The conductive particles include conductive flakes and conductive nanoparticles. A dispersant coats the conductive particles at a loading level of at least about 0.1 mg/m$^2$ to about 0.8 mg/m$^2$.

A conductive trace deposited on a substrate from a rollerball pen comprises a percolative network of conductive particles comprising one or more metals. The conductive particles include conductive flakes and conductive nanoparticles. The conductive trace has a conductivity of at least about 1% of a bulk metal conductivity and a reflectance of greater than 40%.

A conductive trace formed by: providing a conductive ink in a rollerball pen; moving the rollerball pen over a surface to deposit the conductive ink on the surface; and drying the conductive ink at room temperature, thereby forming the conductive trace. The conductive ink comprises an aqueous solvent and conductive particles comprising one or more metals dispersed therein at a concentration of at least about 30 wt. %. The conductive particles include conductive flakes and conductive nanoparticles. A dispersant coats the conductive particles at a loading level of from about 0.1 mg/m$^2$ to about 0.8 mg/m$_2$.

A method of forming a conductive trace comprises providing a conductive ink in a rollerball pen, moving the rollerball pen over a surface to deposit the conductive ink on the surface, and drying the conductive ink at room temperature, thereby forming the conductive trace. The conductive ink comprises an aqueous solvent and conductive particles comprising one or more metals dispersed therein at a concentration of at least about 30 wt. %. The conductive particles comprise conductive flakes and conductive nanoparticles, and a dispersant coats the conductive particles at a loading level of from about 0.1 mg/m$^2$ to about 0.8 mg/m$^2$.

The terms "comprising," "including," "containing" and "having" are used interchangeably throughout this disclosure as open-ended terms to refer to the recited elements (or steps) without excluding unrecited elements (or steps).

DETAILED DESCRIPTION

Figure 1:
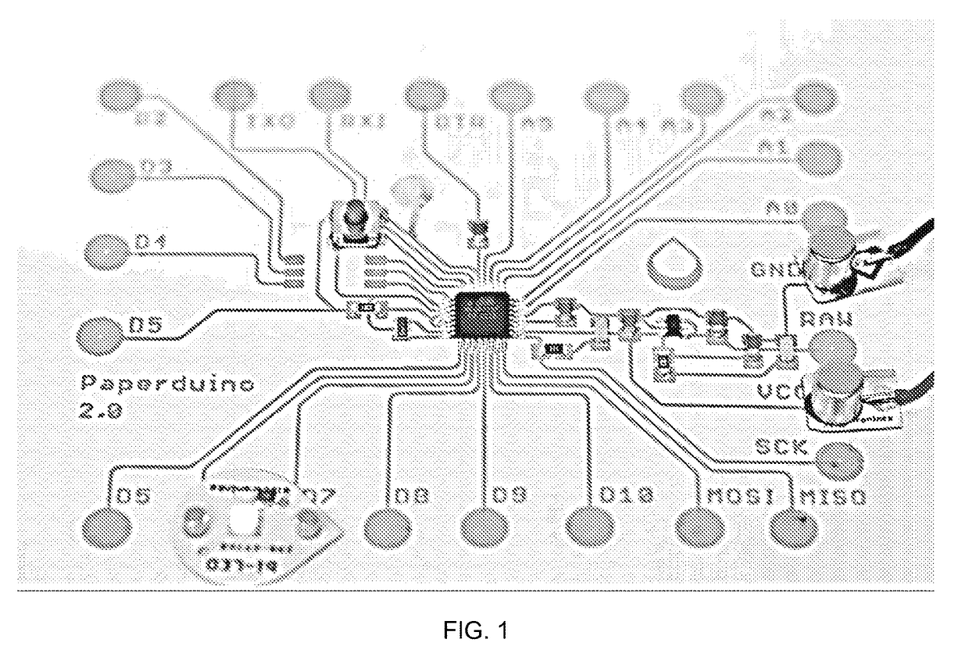
FIG. 1 shows a number of conductive traces formed on paper to provide connections between electronic devices.

A highly stable and quick-drying conductive ink formulation has been developed for use with a rollerball pen to form conductive traces on a wide range of substrates. The conductive traces comprise a metal such as silver and may exhibit a conductivity up to about 20% of a bulk conductivity of the metal. The conductive ink may be deposited onto paper, plastic, and other flexible or rigid substrates to form traces that serve as the wiring for electronic devices, as shown for example in FIG. 1.

Figure 2A:
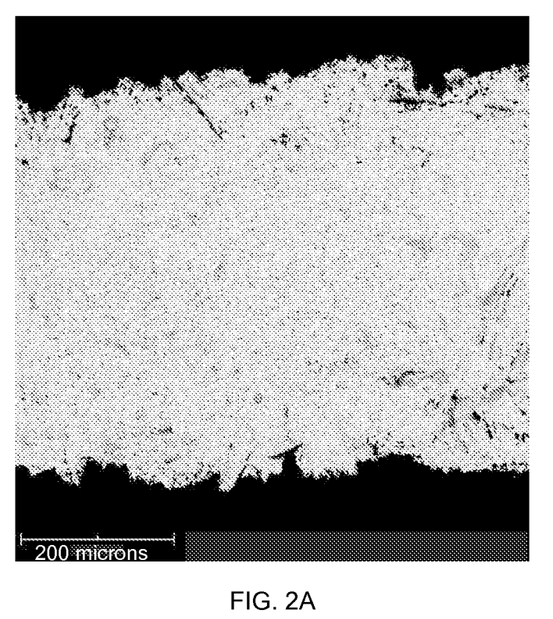
FIGS. 2A and 2B show scanning electron microscopy (SEM) images at two different magnifications of an exemplary conductive trace formed on copy paper.
Figure 2B:
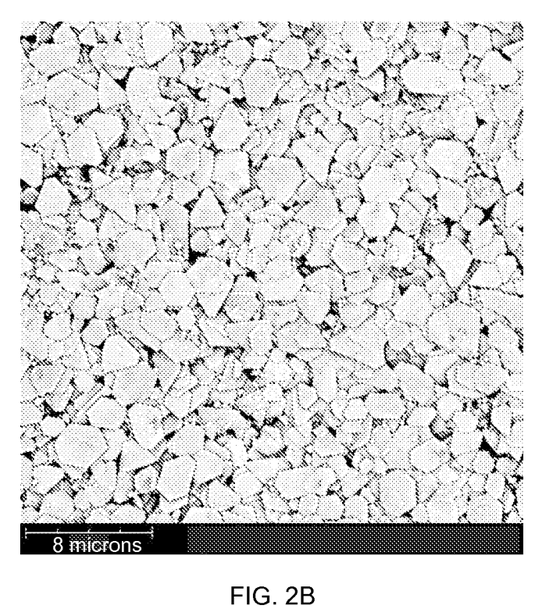
Figure 3A:
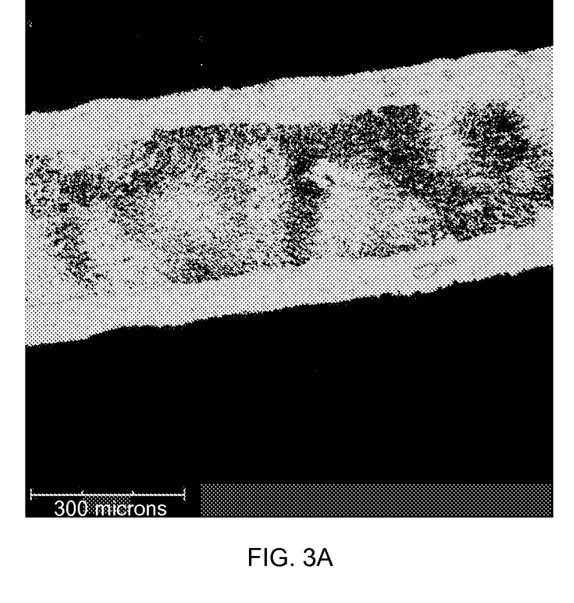
FIGS. 3A and 3B show SEM images at two different magnifications of an exemplary conductive trace formed on photo paper.
Figure 3B:
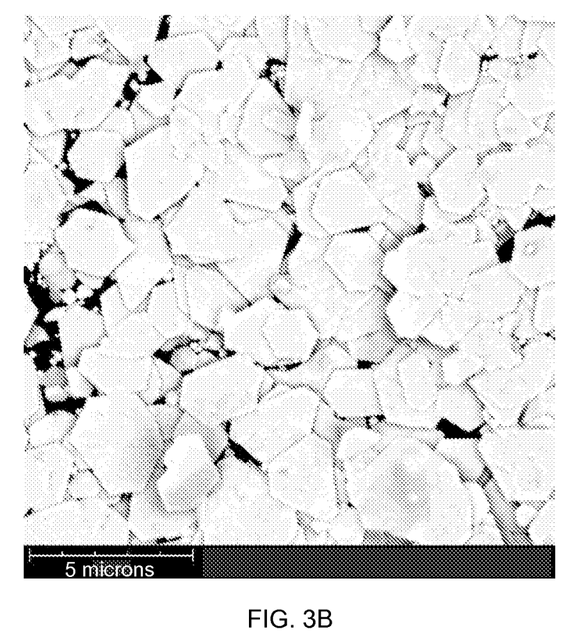

FIGS. 2A and 2B show scanning electron microscopy (SEM) images at two different magnifications of an exemplary conductive trace formed on copy paper, and FIGS. 3A and 3B show SEM images at two different magnifications of an exemplary conductive trace formed on photo paper. The conductive trace comprises a percolative network of conductive particles comprising silver. As shown in FIGS. 2B and 3B, the conductive particles may include conductive particles of different sizes and morphologies, including flakes and nanoparticles.

The conductive ink used to form the traces comprises an aqueous solvent and conductive particles comprising one or more metals dispersed therein at a concentration of at least about 30 wt. %. A dispersant coats the conductive particles at a loading level of from about 0.1 mg/m$^2$ to about 0.8 mg/m². The conductive particles include the conductive flakes and conductive nanoparticles shown for example in FIG. 2B after deposition.

Due to the high loading level of conductive particles in the conductive ink formulation, a low resistance conductive trace may be formed when the ink is deposited onto paper (or another substrate). Also, the use of conductive particles having a bimodal size distribution and/or different morphologies may improve particle packing in the conductive trace, and thus promote percolation (formation of an electrically continuous path through the conductive particles).

Preferably, the conductive ink has a long shelf life or dispersion stability, which, as would be recognized by one of ordinary skill in the art, may be in conflict with achieving a high solids (particle) loading. The addition of a dispersant to enhance the stability of the ink may also detrimentally affect the conductivity of the trace written on the substrate. However, the inventors have found that, by using an amount of dispersant in the range of 0.1 mg/m² to about 0.8 mg/m², combined with a suitable ratio of conductive flakes to conductive nanoparticles as discussed below, a stable and quick-drying conductive ink can be formed even at high solids loading levels. When applied to a substrate such as paper using a rollerball pen, the conductive ink dries to form a highly conductive trace that also features high reflectivity and good adhesion to the substrate.

Ideally, to form a trace with the desired conductivity, the concentration of the conductive particles in the ink is at least about 40 wt. %, at least about 50 wt. %, at least about 60 wt. %, at least about 70 wt. %, or at least about 80 wt. %. The concentration may also be as high as about 85 wt. %, or as high as about 90 wt. %.

The amount of the dispersant may be at least about 0.2 mg/m², at least about 0.3 mg/m², at least about 0.4 mg/m², or at least about 0.5 mg/m², where the units represent mass of the dispersant in mg per m² of surface area of the conductive particles. Typically, the amount of the dispersant does not exceed about 0.7 mg/m² or about 0.8 mg/m². When adsorbed to the surfaces of the conductive particles (flakes and/or nanoparticles), the dispersant prevents or minimizes aggregation, thereby enhancing the stability of the ink composition. If an amount in excess of 0.8 mg/m² is used, however, it may inhibit electrical contact between the conductive flakes and particles and reduce the conductivity of the conductive trace.

The dispersant may comprise a polymer, such as a polyelectrolyte with a molecular weight greater than about 1000 g/mol (e.g., polyvinylpyrrollidone (PVP), polyacrylic acid (PAA) and/or hydroxypropyl cellulose (HPC)). Generally speaking, the polymer may be selected from the group consisting of polyvinylpyrrolidone (PVP), polyacrylic acid (PAA), hydroxypropyl cellulose (HPC), polyvinylmethylether (PVME), polyvinyl alcohol (PVA), polyoxyethylene glycol sorbitan alkyl esters, polyoxypropylene glycol alkyl ethers, polyoxyethylene glycol alkyl ethers, and polyoxyethylene glycol octylphenol ethers. The dispersant may alternatively not comprise a polymer. For example, the dispersant may be perfluorooctanesulfonate (PFOS) or perfluorononanoic acid (PFNA).

The conductive flakes may have a plate-like morphology with an average thickness that is much smaller than an average lateral dimension of the flakes, where "lateral dimension" refers to a linear dimension (e.g., width, length and/or diameter) measured normal to the thickness of the flake. Typically, the average thickness of the conductive flakes is 1-2 orders of magnitude smaller than the average width (or other lateral dimension). For example, the conductive flakes may have an average width of a few microns (e.g., about 1-5 microns), while the average thickness of the conductive flakes may be tens to hundreds of nanometers. In general, the average lateral dimension of the conductive flakes may be at least about 500 nm, at least about 750 nm, at least about 1 micron, or at least about 2 microns in size, and is typically no greater than about 5 microns, no greater than about 4 microns, or no greater than about 3 microns. The average thickness of the conductive flakes may be at least about 10 nm, at least about 50 nm, or at least about 100 nm, and is typically no greater than about 300 nm, no greater than about 200 nm, or no greater than about 100 nm. Values referred to as "average" values herein, such as average thickness or average width, refer to nominal values for a plurality of particles or flakes. As would be recognized by one of ordinary skill in the art, individual particles or flakes within the plurality may exhibit deviations from the average value.

The conductive nanoparticles may have a substantially spherical shape and thus may be referred to as conductive nanospheres. Alternatively, the conductive nanoparticles may have an irregular or other morphology, such as a faceted shape or an acicular shape. The conductive nanoparticles typically have an average linear dimension (length, width and/or diameter) of about 500 nm or less, about 200 nm or less, or about 100 nm or less. The average linear dimension may also be at least about 10 nm, at least about 50 nm, or at least about 100 nm. For example, the average linear dimension of the conductive nanoparticles may range from about 10 nm to about 200 nm, or from about 100 nm to about 500 nm.

By including an appropriate weight ratio of the conductive flakes to the conductive nanoparticles, good particle packing may be achieved in the conductive ink such that a percolative network of conductive particles may be formed in the deposited conductive trace. For example, the weight ratio may be at least about 0.1:1, at least about 1:1, at least about 3:1, at least about 6:1, or at least about 9:1. Typically, the weight ratio is no greater than about 20:1, or no greater than about 15:1.

The conductive particles including the conductive flakes and conductive nanoparticles may comprise one or more metals selected from the transition metals, the metalloids, and/or the rare earth metals. For example, the one or more metals may be selected from the group consisting of: Al, Sc, Ti, V, Cr, Mn, Fe, Co, Ni, Cu, Y, Zr, Nb, Mo, Tc, Ru, Rh, Pd, Ag, In, Sn, Sb, Hf, Ta, W, Re, Os, Ir, Pt, and Au. Preferred metals may include Ag, Au, Cu, Ni, Pt, and/or Pd. The conductive particles may comprise substantially pure metals containing only incidental impurities, metal alloys, and/or metal oxides (e.g., tin oxide or indium-tin oxide). It is also contemplated that the conductive particles may include a coating (e.g., a conductive coating or a passivation layer) on individual flakes and/or particles. The coating may include one or more of the metals mentioned above.

The conductive ink may further comprise a viscosifier to adjust the flow behavior of the ink. For example, the viscosifier may be selected from among hydroxylethyl cellulose (HEC), xantham gum, and guar gum. In one example, the viscosifier is HEC at a concentration of from about 2 wt. % to about 3 wt. % with respect to the conductive particles. The viscosity of the conductive ink may range from about 4000 centipoise to about 6000 centipoise under zero shear stress conditions.

A surfactant may be added to the conductive ink to reduce surface tension and promote good wetting of the paper or other substrate. If used, the surfactant may comprise a polymeric fluorosurfactant such as BYK® 340 (BYK-Chemie GmbH, Wesel, Germany).

The conductive ink may be prepared by forming a mixture including the conductive flakes and nanoparticles in an aqueous solvent (such as water) along with the dispersant (e.g., PAA). The mixture may be sonicated to ensure that the flakes and nanoparticles are well dispersed. A viscosifier may be added to increase the viscosity of the mixture, and a small amount of a surface tension modifier (surfactant) may also or alternatively be added to improve the smoothness of the dispensed ink on the paper or other substrate. After addition and mixing of all of the desired components of the conductive ink, the ink may be loaded into a rollerball pen for writing. Rollerball pens known in the art typically have ball diameters ranging from 250 microns to nearly one millimeter. A preferred range of rollerball pen diameters for use with the conductive ink is from about 800 microns to about 1000 microns.

The conductive ink designed as described above may exhibit a dispersion stability or shelf life of at least about 8 months, or at least about 12 months. The shelf life may also be about 24 months or more. Typically, the dispersion stability/shelf life is from about 8 months to about 12 months.

A conductive trace may be formed from the conductive ink by first providing a conductive ink in a rollerball pen, where, as set forth above, the conductive ink comprises an aqueous solvent and conductive particles comprising one or more metals dispersed therein at a concentration of at least about 30 wt. %, where the conductive particles include conductive flakes and conductive nanoparticles, and a dispersant coats the conductive particles at a loading level of from about 0.1 mg/m$^2$ to about 0.8 mg/m$^2$. The rollerball pen is then moved over a surface to deposit the conductive ink on the surface. The conductive ink is dried at room temperature to form the conductive trace.

The conductive ink is engineered to dry rapidly. The drying time may be no greater than 40 seconds, no greater than 30 seconds, and may be about 20 seconds or less, about 10 seconds or less, or about 5 seconds or less. Drying time can be determined by measuring the time required for the resistivity of the conductive trace to stabilize after depositing the conductive ink on a surface, where resistivity (p) is defined as: $p=(A/L)R$, where A is cross-sectional area, L is length, and R is electrical resistance. A two-point probe may be used to make the resistivity measurement, which may entail applying a current (I) to the specimen and measuring the voltage drop (V), where R may be determined from Ohm's Law, $V=IR$. A profilometer may be used to measure the cross-sectional area A.

The conductive trace formed upon drying may comprise a percolative network of conductive particles comprising one or more metals, as shown for example in FIG. 2B. The conductive particles include conductive flakes and conductive nanoparticles, and the conductive trace may have a conductivity of at least about 1% of a bulk metal conductivity, as explained below, and a reflectance of greater than about 40%.

As set forth above in the description of the conductive ink, the one or more metals of the conductive trace may be selected from the transition metals, the metalloids, and/or the rare earth metals. For example, the one or more metals may be selected from the group consisting of: Al, Sc, Ti, V, Cr, Mn, Fe, Co, Ni, Cu, Y, Zr, Nb, Mo, Tc, Ru, Rh, Pd, Ag, In, Sn, Sb, Hf, Ta, W, Re, Os, Ir, Pt, and Au. Preferred metals may include Ag, Au, Cu, Ni, Pt, and/or Pd. The conductive particles may comprise substantially pure metals containing only incidental impurities, metal alloys, and/or metal oxides (e.g., tin oxide or indium-tin oxide). It is also contemplated that the conductive particles may include a coating (e.g., a conductive coating or a passivation layer) on individual flakes and/or particles. The coating may include one or more of the metals mentioned above.

The conductive flakes and the conductive nanoparticles of the conductive trace may have any of the morphologies and sizes set forth above in the description of the conductive ink. Because the ink is deposited and dried at room temperature, excessive sintering may be avoided and the flakes and nanoparticles of the conductive trace may be similar or identical in morphology/size to those of the as-deposited conductive ink.

Also as explained above, an appropriate weight ratio of the conductive flakes to the conductive nanoparticles may be selected to achieve good particle packing and formation of a percolative network of conductive particles in the deposited conductive trace. For example, the weight ratio may be at least about 0.1:1, at least about 1:1, at least about 3:1, at least about 6:1, or at least about 9:1. Typically, the weight ratio is no greater than about 20:1, or no greater than about 15:1.

The aqueous solvent that serves as a carrier for the conductive particles in the ink formulation is removed when the ink is dried; however, the dispersant remains after drying. Accordingly, the percolative network of conductive particles may comprise a dispersant coated thereon, and the dispersant may be present in an amount ranging from about 0.1 mg/m$^2$ to about 0.8 mg/m$^2$, or from about 0.5 mg/m$^2$ to about 0.8 mg/m$^2$.

The conductive trace exhibits a conductivity of at least 0.1% of a bulk metal conductivity, where bulk metal conductivity refers to the bulk conductivity of the metal making up a primary portion of, or an entirety of, the conductive trace. The conductivity may also be at least about 1% of the bulk metal conductivity, at least about 5% of the bulk metal conductivity, at least about 10% of the bulk metal conductivity, or at least about 15% of the bulk metal conductivity. The conductivity of the conductive trace (or the bulk metal) may be determined by measuring resistivity (p) as set forth above, since conductivity is the reciprocal of resistivity. A two-point probe or a four-point probe method may be used with a profilometer. Advantageously, the electrical resistivity of the conductive trace is about $10^{-5}$ Ohm-cm or less. The conductivity may be as high as about 20% of the bulk metal conductivity.

Besides good conductivity, the conductive trace may also have a highly reflective surface. A UV-Vis reflectance spectrophotometer may be used to measure the intensity of light reflected from a conductive trace (I). When compared to the intensity of light reflected from a reference material ($I_0$), such as WS-1, a Teflon diffuse reflectance standard, a ratio $I/I_0$ (reflectance) may be determined. The reflectance is typically multiplied by 100 and expressed as a percentage (% reflectance). Accordingly, as determined by UV-Vis reflectance measurements, the conductive trace may exhibit reflectance values of at least about 40%, at least about 50%, at least about 60%, at least about 70%, or at least about 80%. The reflectance of the conductive trace may be as high as about 90%, or as high as about 99%.

It is advantageous for the conductive trace to adhere strongly to the substrate. Adhesion of the trace to the substrate may be measured according to ASTM standard D3359. The test method entails producing cross-hatch cuts in the conductive trace and applying tape to the cross-hatched area. After the tape is pulled off, the cut area is inspected and rated. The conductive traces produced as described here are found to have sufficient adhesion to the substrate to pass the test, as indicated in the tables below.

A method of forming a conductive trace includes providing a conductive ink in a rollerball pen, moving the rollerball pen over a surface to deposit the conductive ink on the surface; and drying the conductive ink at room temperature to form the conductive trace. The conductive ink comprises, as set forth above, an aqueous solvent and conductive particles comprising one or more metals dispersed therein at a concentration of at least about 30 wt. %, where the conductive particles include conductive flakes and conductive nanoparticles, and a dispersant coats the conductive particles at a loading level of from about 0.1 mg/m$^2$ to about 0.8 mg/m$^2$.

The drying time is extremely rapid and takes place in about 30 seconds or less, as set forth above. The conductive trace formed by the preceding method may have any of the characteristics described previously.

Figure 4:
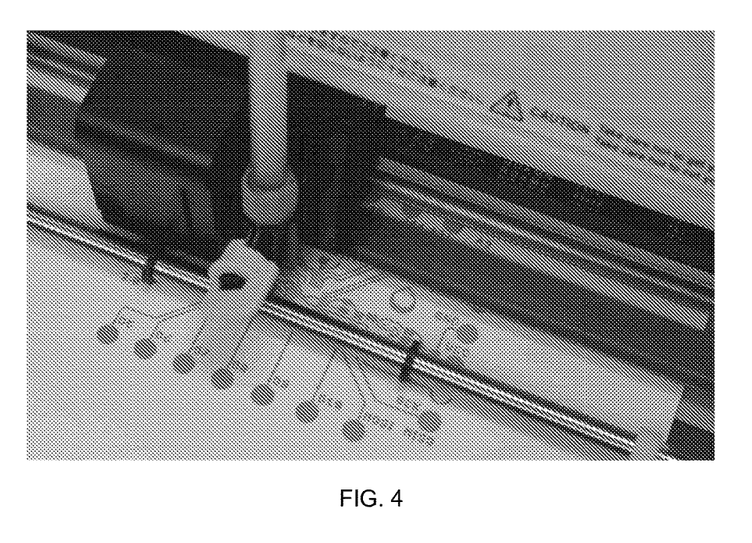
FIG. 4 shows deposition of a conductive ink on a paper substrate from a rollerball pen held in place and moved by a plotter.
Figure 5:
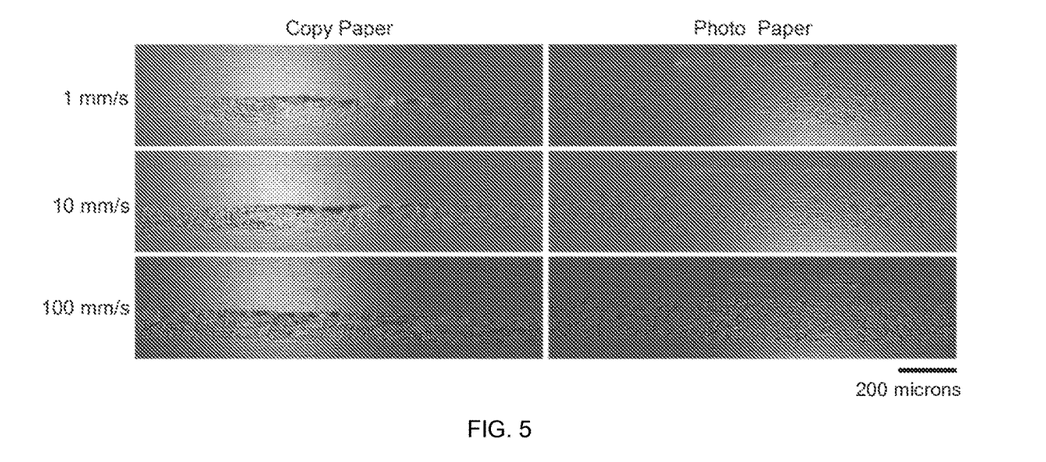
FIG. 5 shows computed tomography (CT) images of conductive traces formed at different plotter scanning speeds (1 mm/s, 10 mm/s and 100 mm/s) on copy paper and photo paper.

The rollerball pen may be moved over the substrate manually or automatically (e.g., via a plotter, as shown in FIG. 4). Thus, the conductive ink may be deposited on the substrate at any desired speed. Deposition speeds of at least about 1 mm/s, at least about 10 mm/s, or at least about 100 mm/s are readily achievable, and exemplary traces formed at these speeds are shown via computed tomography (CT) images in FIG. 5. Typical traces range in width and thickness from about 500 microns to about 1200 microns.

Given the room temperature processing conditions, the substrate may comprise any of a number of materials, including heat sensitive materials such as polymers and paper (e.g., photo paper, copy paper, cardstock, etc.), as well as ceramics, metals and/or semiconductors.

TABLE 1

Summary of Properties of Exemplary Conductive Traces

|  | Example 1 | Example 2 | Example 3 |
|---|---|---|---|
| Conductivity | Good ($\leq 10^{-4}$ Ohm-cm) | Excellent ($\leq 10^{-5}$ Ohm-cm) | Excellent ($\leq 10^{-5}$ Ohm-cm) |
| Reflectance/ Metallic appearance | Excellent (>60%) | Excellent (>60%) | Excellent (>60%) |
| Adhesion | Excellent (passes D3359) | Excellent (passes D3359) | Excellent (passes D3359) |
| Solderability | Fair (solders with difficulty) | Good (solders, requires care) | Excellent (solders easily) |
| Drying time | Fair (>30 s) | Good (<30 s and >20 s) | Excellent (10 s or less) |

|  | Example 4 | Example 5 | Example 6 |
|---|---|---|---|
| Conductivity | Excellent ($\leq 10^{-5}$ Ohm-cm) | Good ($\leq 10^{-4}$ Ohm-cm) | Fair |
| Reflectance/ Metallic appearance | Excellent (>60%) | Excellent (>60%) | Fair |
| Adhesion | Excellent (passes D3359) | Excellent (passes D3359) | Excellent (passes D3359) |
| Solderability | Excellent (solders easily) | Fair (solders with difficulty) | Fair (solders with difficulty) |
| Drying time | Excellent (10 s or less) | Excellent (10 s or less) | Excellent (10 s or less) |

EXAMPLE 1

A conductive ink formulation is produced by dispersing 90% by weight silver flakes (average size 1-3 microns) and 10% by weight silver nanoparticles (average size 50-500 nm) using a poly(acrylic acid) dispersant at a loading level of 0.2 mg/m$^2$. The nanoparticles are substantially spherical in morphology. The weight percentage of the silver in the solution (the solids loading) is adjusted to be 20 wt. % and the viscosity is increased by adding hydroxyethyl cellulose as a viscosifier at a concentration of 3% by weight of the silver. The conductive silver ink is thoroughly mixed and the final viscosity is determined to be 4000 cPs. The ink is deposited onto a substrate (paper) and dries rapidly at room temperature to form a silver trace. Upon drying, the resistivity of the silver trace is measured to be $\leq 10^{-4}$ Ohm-cm, which corresponds to a conductivity of about 1% of the bulk silver conductivity (Ag resistivity is $1.59 \times 10^{-6}$ Ohm-cm) at room temperature, and the silver trace is observed to have a metallic appearance.

EXAMPLE 2

A conductive ink formulation is produced by dispersing 90% by weight silver flakes (average size 1-3 microns) and 10% by weight silver nanoparticles (average size 50-500 nm) using a poly(acrylic acid) dispersant at a loading level of 0.2 mg/m$^2$. The nanoparticles are substantially spherical in morphology. The weight percentage of the silver in the solution (the solids loading) is adjusted to be 50 wt. % and the viscosity is increased by adding hydroxyethyl cellulose as a viscosifier at a concentration of 3% by weight of the silver. The conductive silver ink is thoroughly mixed and the final viscosity is determined to be 4000 cPs. The ink is deposited onto a substrate and dries rapidly at room temperature to form a silver trace. Upon drying, the resistivity of the silver trace is measured to be $\leq 5 \times 10^{-5}$ Ohm-cm, which corresponds to a conductivity of about 2% of the bulk silver conductivity at room temperature, and the silver trace is observed to have a metallic appearance.

EXAMPLE 3

A conductive ink formulation is produced by dispersing 90% by weight silver flakes (average size 1-3 microns) and 10% by weight silver nanoparticles (average size 50-500 nm) using a poly(acrylic acid) dispersant at a loading level of 0.2 mg/m$^2$. The nanoparticles are substantially spherical in morphology. The weight percentage of the silver in the solution (the solids loading) is adjusted to be 80 wt. % and the viscosity is increased by adding hydroxyethyl cellulose as a viscosifier at a concentration of 3% by weight of the silver. The conductive silver ink is thoroughly mixed and the final viscosity is determined to be 4000 cPs. The ink is deposited onto a substrate and dries rapidly at room temperature to form a silver trace. Upon drying, the resistivity of the silver trace is measured to be $\leq 10^{-5}$ Ohm-cm, which corresponds to a conductivity of about 10% of the bulk silver conductivity at room temperature, and the silver trace is observed to have a metallic appearance.

EXAMPLE 4

A conductive ink formulation is produced by dispersing 90% by weight silver flakes (average size 1-3 microns) and 10% by weight silver nanoparticles (average size 50-500 nm) using a poly(acrylic acid) dispersant at a loading level of 0.2 mg/m$^2$. The nanoparticles are substantially spherical in morphology. The weight percentage of the silver in the solution (the solids loading) is adjusted to be 50 wt. % and the viscosity is increased by adding hydroxyethyl cellulose as a viscosifier at a concentration of 3% by weight of the silver. The conductive silver ink is thoroughly mixed and the final viscosity is determined to be 4000 cPs. The ink is deposited onto a substrate and dries rapidly at room temperature to form a silver trace. Upon drying, the resistivity of the silver trace is measured to be $\leq 10^{-5}$ Ohm-cm, which corresponds to a conductivity of about 4% of the bulk silver conductivity at room temperature, and the silver trace is observed to have a metallic appearance.

EXAMPLE 5

A conductive ink formulation is produced by dispersing 50% by weight silver flakes (average size 1-3 microns) and 50% by weight silver nanoparticles (average size 50-500 nm) using a poly(acrylic acid) dispersant at a loading level of 0.2 mg/m². The nanoparticles are substantially spherical in morphology. The weight percentage of the silver in the solution (the solids loading) is adjusted to be 50 wt. % and the viscosity is increased by adding hydroxyethyl cellulose as a viscosifier at a concentration of 3% by weight of the silver. The conductive silver ink is thoroughly mixed and the final viscosity is determined to be 4000 cPs. The ink is deposited onto a substrate and dries rapidly at room temperature to form a silver trace. Upon drying, the resistivity of the silver trace is measured to be $\leq 10^{-5}$ Ohm-cm, which corresponds to a conductivity of about 5% of the bulk silver conductivity at room temperature, and the silver trace is observed to have a metallic appearance.

EXAMPLE 6

A conductive ink formulation is produced by dispersing 10% by weight silver flakes (average size 1-3 microns) and 90% by weight silver nanoparticles (average size 50-500 nm) using a poly(acrylic acid) dispersant at a loading level of 0.2 mg/m². The nanoparticles are substantially spherical in morphology. The weight percentage of the silver in the solution (the solids loading) is adjusted to be 50 wt. % and the viscosity is increased by adding hydroxyethyl cellulose as a viscosifier at a concentration of 3% by weight of the silver. The conductive silver ink is thoroughly mixed and the final viscosity is determined to be 4000 cPs. The ink is deposited onto a substrate and dries rapidly at room temperature to form a silver trace. Upon drying, the resistivity of the silver trace is measured to be $\leq 10^{-4}$ Ohm-cm, which corresponds to a conductivity of about 5% of the bulk silver conductivity at room temperature, and the silver trace is observed to have a metallic appearance.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A conductive ink for a rollerball pen, the conductive ink comprising:
an aqueous solvent;
conductive particles dispersed in the aqueous solvent at a concentration of at least about 30 wt. %, the conductive particles comprising conductive silver flakes and conductive silver nanoparticles, wherein a weight ratio of the conductive silver flakes to the conductive silver nanoparticles is at least about 1:1; and
a dispersant coating the conductive particles at a loading level of from about 0.1 mg/m² to about 0.8 mg/m².

2. The conductive ink of claim 1, wherein the weight ratio of the conductive silver flakes to the conductive silver nanoparticles is i) at least about 3:1 or ii) at least about 9:1.

3. The conductive ink of claim 1, wherein the concentration of the conductive silver particles is at least about 50 wt. %.

4. The conductive ink of claim 1, wherein the loading level of the dispersant is from about 0.5 mg/m² to about 0.8 mg/m².

5. The conductive ink of claim 1, wherein the conductive silver flakes comprise an average lateral dimension of from about 1 micron to about 4 microns, and an average thickness of from about 10 nm to about 100 nm.

6. The conductive ink of claim 1, wherein the conductive silver nanoparticles comprise i) conductive nanospheres having a substantially spherical shape or ii) an average linear dimension of about 500 nm or less.

7. The conductive ink of claim 1, comprising a shelf life of i) at least about 8 months or ii) at least about 12 months.

8. The conductive ink of claim 1, comprising a viscosity of from about 4000 centipoise to about 6000 centipoise at room temperature.

9. The conductive ink of claim 1, further comprising a viscosifier or a surfactant in the aqueous solvent.

10. A conductive trace formed on a substrate from a rollerball pen, the conductive trace comprising:
a percolative network of conductive particles, the conductive particles including conductive silver flakes and conductive silver nanoparticles, wherein a weight ratio of the conductive silver flakes to the conductive silver nanoparticles is at least about 1:1, wherein the conductive trace has a conductivity of at least about 1% of a bulk metal conductivity and a reflectance of greater than 40%.

11. The conductive trace of claim 10, wherein the weight ratio of the conductive silver flakes to the conductive silver particles is i) at least about 3:1 or ii) at least about 9:1.

12. The conductive trace of claim 10, wherein the conductive silver flakes comprise an average lateral dimension of from about 1 micron to about 4 microns and an average thickness of from about 10 nm to about 100 nm.

13. The conductive trace of claim 10, wherein the conductive silver nanoparticles comprise one selected from the group consisting of i) conductive nanospheres having a substantially spherical shape; ii) an average linear dimension of about 500 nm or less; and iii) a dispersant coated thereon, the dispersant being present in an amount of from about 0.5 mg/m² to about 0.8 mg/m².

14. The conductive trace of claim 10, comprising an electrical resistivity of about $10^{-5}$ Ohm-cm or less.

15. A conductive trace formed by:
providing a conductive ink in a rollerball pen, the conductive ink comprising:
an aqueous solvent;
conductive particles dispersed in the aqueous solvent at a concentration of at least about 30 wt. %, the conductive particles comprising conductive silver flakes and conductive silver nanoparticles, wherein a weight ratio of the conductive silver flakes to the conductive silver nanoparticles is at least about 1:1; and a dispersant coating the conductive particles at a loading level of from about 0.1 mg/m$^2$ to about 0.8 mg/m$^2$;

moving the rollerball pen over a surface to deposit the conductive ink on the surface; and drying the conductive ink at room temperature, thereby forming a conductive trace.

16. The conductive trace of claim 15 comprising a conductivity of at least 1% of a bulk metal conductivity or at least 5% of bulk metal conductivity.

17. A method of forming a conductive trace, the method comprising:

providing a conductive ink in a rollerball pen, the conductive ink comprising:

an aqueous solvent;

conductive particles dispersed in the aqueous solvent at a concentration of at least about 30 wt. %, the conductive particles comprising conductive silver flakes and conductive silver nanoparticles, wherein a weight ratio of the conductive silver flakes to the conductive silver nanoparticles is at least about 1:1; and a dispersant coating the conductive particles at a loading level of from about 0.1 mg/m$^2$ to about 0.8 mg/m$^2$;

moving the rollerball pen over a surface to deposit the conductive ink on the surface; and drying the conductive ink at room temperature, thereby forming the conductive trace.

18. The method of claim 17, wherein the drying time is i) about 30 seconds or less or ii) about 10 seconds or less.

* * * * *